United States Patent
Gardner et al.

[19]

[11] Patent Number: 6,150,708
[45] Date of Patent: Nov. 21, 2000

[54] ADVANCED CMOS CIRCUITRY THAT UTILIZES BOTH SIDES OF A WAFER SURFACE FOR INCREASED CIRCUIT DENSITY

[75] Inventors: Mark I. Gardner, Cedar Creek; H. Jim Fulford, Austin, both of Tex.; Charles E. May, Gresham, Oreg.

[73] Assignee: Advanced Micro Devices, Inc., Sunnyvale, Calif.

[21] Appl. No.: 09/191,305

[22] Filed: Nov. 13, 1998

[51] Int. Cl.[7] .................................................. H01L 25/00
[52] U.S. Cl. ......................... 257/618; 257/446; 257/501; 257/506; 257/618; 257/708; 257/774; 257/777; 257/778
[58] Field of Search .................................... 257/446, 501, 257/506, 777, 778, 774, 708, 618

[56] References Cited

U.S. PATENT DOCUMENTS

| | | | |
|---|---|---|---|
| 5,359,219 | 10/1994 | Hwang | 257/351 |
| 5,815,372 | 9/1998 | Galls | 257/778 |

OTHER PUBLICATIONS

Stanley Wolf and Richard N. Tauber; *Silicon Processing for the VLSI Era, vol. 1—Process Technology*; pp. 8–10, 23–25 and 64–69; 1986.

*Primary Examiner*—Fetsum Abraham
*Attorney, Agent, or Firm*—Timothy M. Honeycutt

[57] ABSTRACT

An integrated circuit employing both sides of a base substrate or wafer and a method of making the same are provided. In one aspect, the integrated circuit includes a base substrate that has a first side and a second side opposite the first side. The first side has a first semiconductor layer and a first isolation structure positioned thereon wherein the first side surrounds the first semiconductor layer. The second side has a second semiconductor layer and a second isolation structure positioned thereon wherein the second isolation structure surrounds the second semiconductor layer. A first circuit device is positioned on the first semiconductor layer. A second circuit device is positioned on the second semiconductor layer. The method enables simultaneous processing of both sides of a given wafer. Fabrication efficiency is increased through higher throughput and much higher yields per wafer.

26 Claims, 8 Drawing Sheets

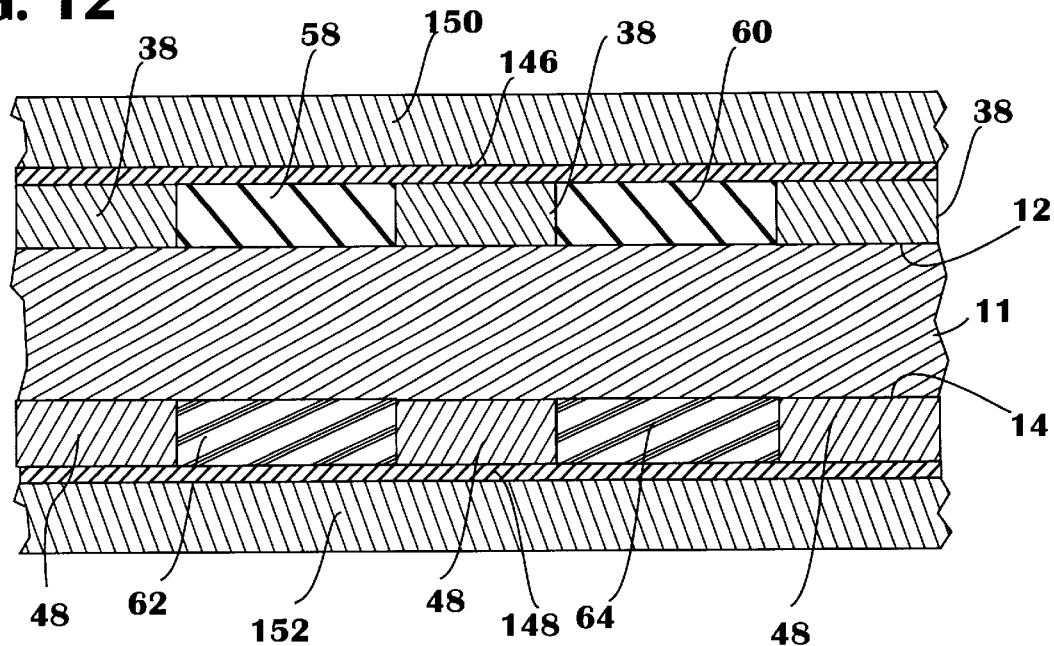
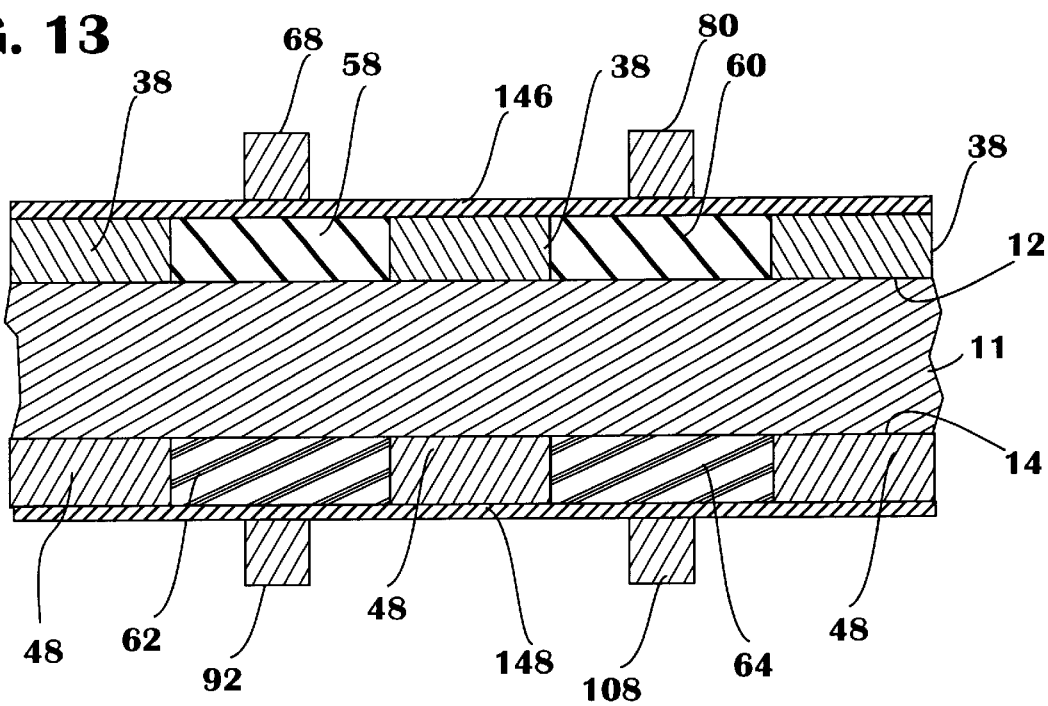

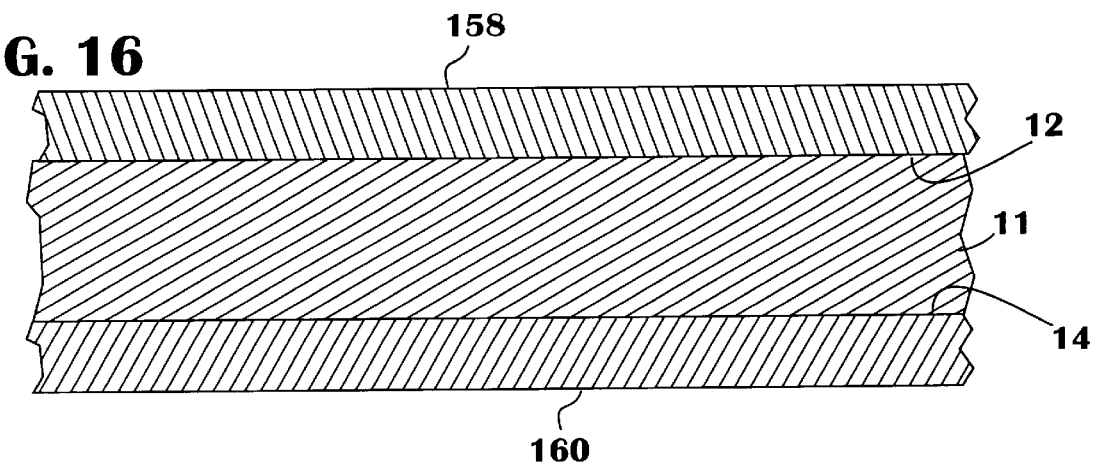
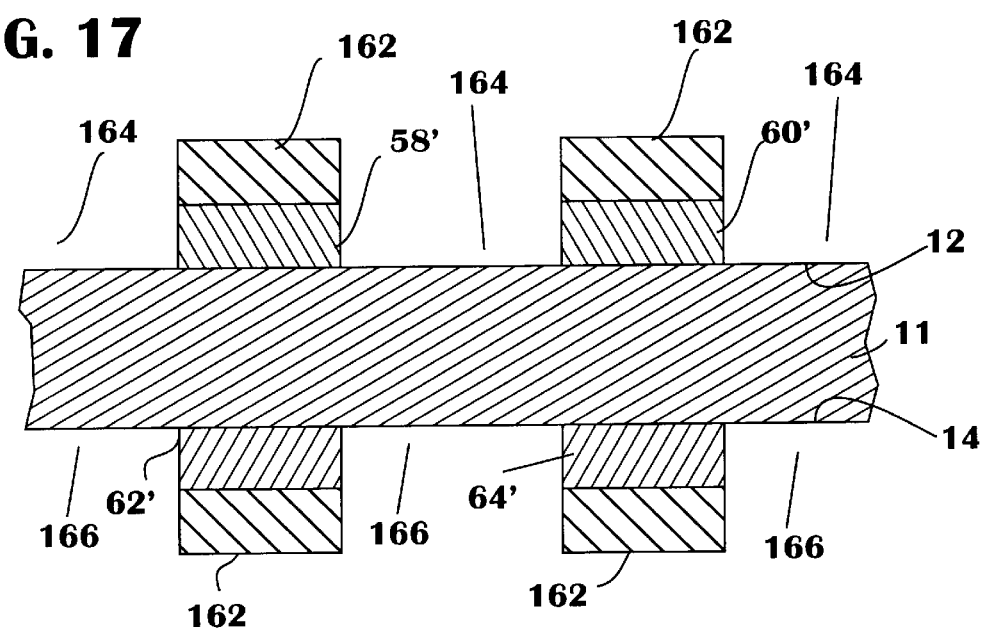
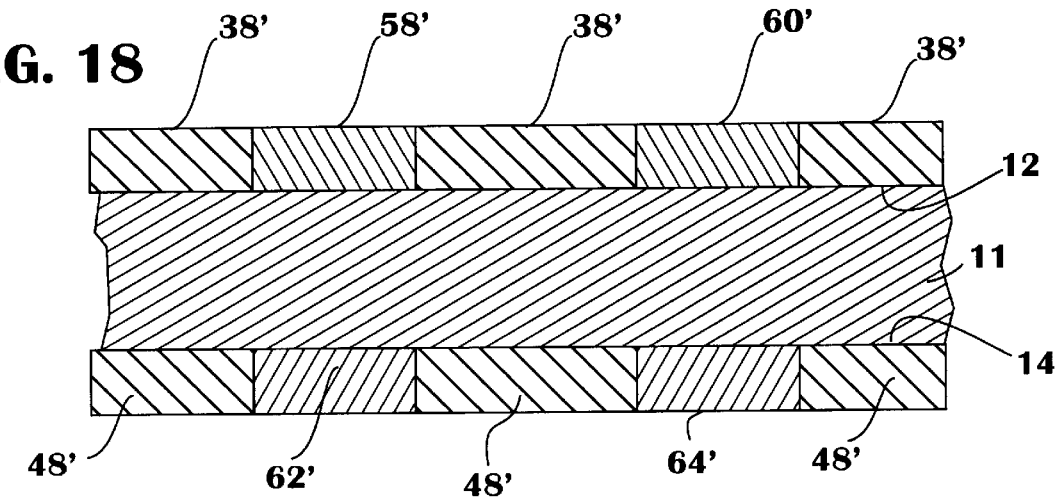

ADVANCED CMOS CIRCUITRY THAT UTILIZES BOTH SIDES OF A WAFER SURFACE FOR INCREASED CIRCUIT DENSITY

BACKGROUND OF THE INVENTION

1. Field of the Invention

This invention relates generally to semiconductor processing, and more particularly to an integrated circuit utilizing both sides of a given wafer and to a method of making the same.

2. Description of the Related Art

The silicon wafer has long been a substrate of choice for designers of semiconductor fabrication processes. Although the earliest solid state electronic circuits utilized germanium as a semiconducting substrate material, designers soon recognized that silicon, with its larger bandgap and more reliably formable oxide for passivation, provided a superior semiconductor processing material. The switch to silicon stemmed from economic as well as technical considerations. At about a tenth of the cost of germanium, electronic grade silicon enabled manufacturers to dramatically reduced manufacturing costs for solid state circuits. Integrated circuits that were formerly affordable only to the military or the space program could be fabricated cheaply enough to be incorporated into components affordable to ordinary consumers.

The starting point in the process of fabricating an integrated circuit on silicon for most applications is the formation of a silicon wafer. Initially, an ingot of monocrystalline silicon is drawn from a vat of molten silicon and cooled. The ingot is then subjected to a sequence of shaping and polishing steps that include the grinding of the ingot to the desired diameter, the grinding of one or more of flats into the exterior of the ingot, and finally the sawing of individual wafers from of the ingot. Each of the individual wafers is then put through a variety of diagnostic tests to determine the extent of any crystalline or other structural defects. If free of significant defects, each wafer is then lapped and ground to within a specified thickness tolerance and etched to remove any work damage caused by the various sawing, lapping and grinding steps. Finally, one side of each wafer is subjected to a chemical-mechanical polishing ("CMP") step to produce a highly reflective, scratch and damage free surface upon which the integrated circuits will be formed.

In conventional semiconductor processing, integrated circuits are implemented on only one side of a given wafer. This historical use of only about one half of the available surface area of a given wafer is the product of two major processing considerations. First, wafer handling is generally a simpler task when one side of a given wafer may be repeatedly touched by various wafer handling equipment without risk of damaging the front or circuit side of the wafer. During a typical conventional process flow, a given wafer is repeatedly picked up, transported, placed into and taken out of various tools, such as chemical vapor deposition ("CVD") reactors, etch reactors, and ion implantation tools. Many of these types of tools incorporate carriers that are specifically designed to receive the relatively flat back side of the wafer. Second, the backside of the conventional wafer is often intentionally left in a relatively rough condition to facilitate extrinsic gettering of impurities. In some conventional fabrication processes, the surface variations following initial slicing and lapping are deemed sufficient. In others, additional mechanical damage is done to the backside by abrasion, grooving or sandblasting to create stress fields on the back side. During subsequent annealing steps, dislocations are generated which relieve these stress fields. These dislocations then serve as gettering sites. Although intrinsic gettering techniques have been developed as an alternative to extrinsic gettering, such as tailoring the oxygen distribution in the wafer, single-sided processing remains the norm.

A key disadvantage associated with conventional integrated circuit fabrication is the less than optimal utilization of both materials and manufacturing time. Since only one side of a given wafer is utilized for circuit implementation, less than half of the theoretical substrate area is actually devoted to circuit fabrication. In addition, nearly every process step to fabricate circuits on a conventional wafer is performed at less than optimum efficiency since only one side of each wafer in a given batch of wafers is actually being processed during the step. For example, in a typical batch dry etching process, a plurality of wafers are positioned in an etch reactor and a volume of etch gas or gases is introduced into the etch chamber. At the conclusion of the etch process, the etch mixture is exhausted from the etch reactor and discarded. The same quantity of etch gases could have been used to etch both sides of the batch of wafers without significant decrease in throughput. However, since only one side of each wafer is etched, a significant quantity of the etch gases are essentially wasted. The same applies to various other process steps, such as the CVD of dielectrics and sputter deposition of metals to name a few. Aside from the considerations of materials utilization, manufacturing time in conventional single-sided wafer processing is less than optimal. For example, the movement of a batch of conventional single-sided wafers into and out of an etch tool requires a finite quantity of time. This quantity of time is dependent on the sheer number of wafers being moved and not on the amount of each wafer that is being processed. In other words, the same amount of time is required for the movement of the batch whether ten, fifty or one hundred percent of the useable surface areas of the wafers are being processed. In conventional processing, this quantity of time is devoted to only about one half of the theoretically useable wafer surface area. However, if both sides of the wafers could be processed, that is, circuits could be fabricated on both sides, the same quantity of time could be devoted to the example movement with approximately twice the effective throughput.

The foregoing example of the movement of wafers into and out of an etch tool is just one simple example. In a typical conventional process flow, a given wafer is picked up, moved, loaded and unloaded scores of times. The underutilization of manufacturing time is cumulative of all of these various movements.

The present invention is directed to overcoming or reducing the effects of one or more of the foregoing disadvantages.

SUMMARY OF THE INVENTION

In accordance with one aspect of the present invention, a semiconductor wafer is provided that includes a base substrate that has a first side and a second side. A first semiconductor layer is positioned on the first side. A first isolation structure is positioned on the first side and around the first semiconductor layer. A second semiconductor layer is positioned on the second side. A second isolation structure is positioned on the second side and around the second semiconductor layer.

In accordance with another aspect of the present invention, a semiconductor wafer is provided that includes a semiconductor substrate that has a first side with a first plurality of active areas and a second side with a second plurality of active areas. A first isolation structure is positioned on the first side and laterally isolates the first plurality of active areas. A second isolation structure is positioned on the second side and laterally isolates the second plurality of active areas.

In accordance with another aspect of the present invention, an integrated circuit is provided that includes a base substrate that has a first side and a second side opposite the first side. A first semiconductor layer and a first isolation structure are positioned on the first side. The first isolation structure surrounds the first semiconductor layer. A first circuit device is positioned on the first semiconductor layer. A second semiconductor layer and a second isolation structure are positioned on the second side. The second isolation structure surrounds the second semiconductor layer. A second circuit device is positioned on the second semiconductor layer.

In accordance with another aspect of the present invention, an integrated circuit is provided that includes a base substrate that has a first side and a second side opposite the first side. The first side has a first semiconductor layer and a first isolation structure positioned thereon wherein the first isolation structure surrounds the first semiconductor layer. The second side has a second semiconductor layer and a second isolation structure positioned thereon wherein the second isolation structure surrounds the second semiconductor layer. A first circuit device is positioned on the first semiconductor layer. A second circuit device is positioned on the second semiconductor layer.

In accordance with another aspect of the present invention, a method of fabricating an integrated circuit on a base substrate that has a first side and a second side opposite the first side is provided. The method includes the steps of forming a first semiconductor layer on the first side and forming a first isolation structure on the first side surrounding the first semiconductor layer. A second semiconductor layer is formed on the second side. A second isolation structure is formed on the second side surrounding the second semiconductor layer. A first circuit device is formed on the first semiconductor layer and a second circuit device is formed on the second semiconductor layer.

BRIEF DESCRIPTION OF THE DRAWINGS

The foregoing and other advantages of the invention will become apparent upon reading the following detailed description and upon reference to the drawings in which:

FIG. 12 is a cross-sectional view like FIG. 10 depicting formation of insulating and conductor layers on the opposite sides of the base substrate in accordance with the present invention;

FIG. 13 is a cross-sectional view like FIG. 12 depicting definition of gate electrodes from the conductor layers on the opposite sides of the base substrate in accordance with the present invention;

FIG. 16 is cross-sectional view like FIG. 5, but depicts initial epitaxial growth of semiconductor layers in an alternate exemplary process flow in accordance with the present invention;

FIG. 17 is a cross-sectional view like FIG. 16 depicting definition of active areas from the semiconductor layers in accordance with the present invention;

FIG. 18 is a cross-sectional view like FIG. 17 depicting formation of isolation structures around the active areas in accordance with the present invention;

DETAILED DESCRIPTION OF SPECIFIC EMBODIMENTS

Figure 1:
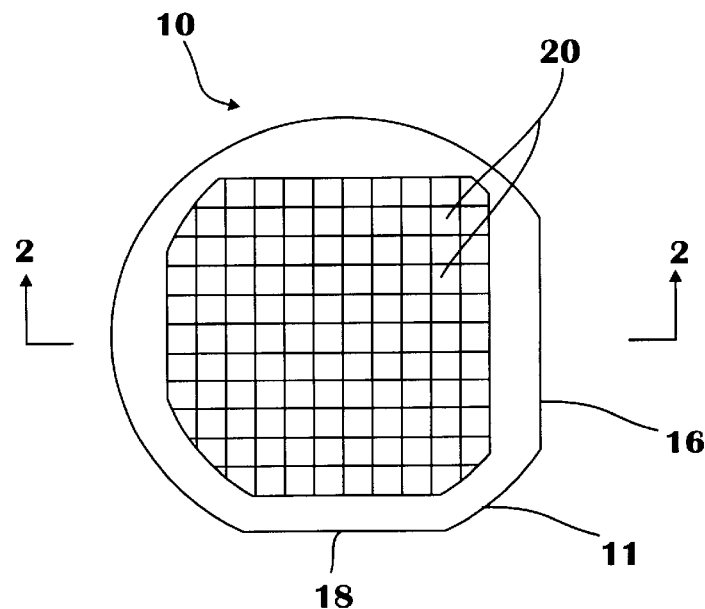
FIG. 1 is a plan view of an exemplary embodiment of an integrated circuit in accordance with the present invention.
Figure 2:
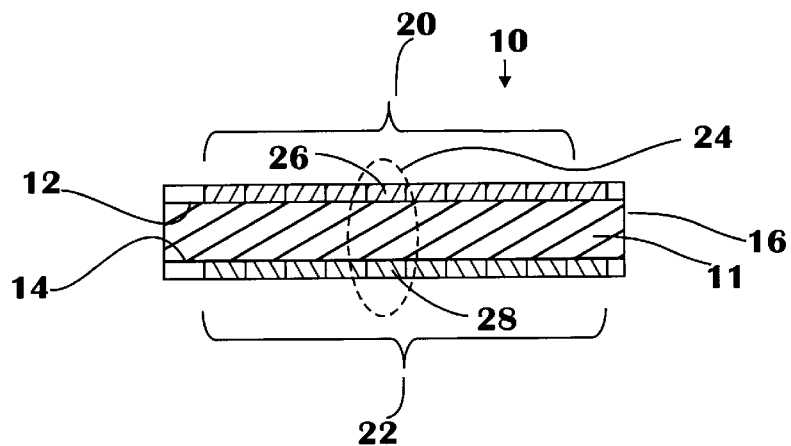
FIG. 2 is a cross-sectional view of FIG. 1 taken at section 2—2 in accordance with the present invention.

In the drawings described below, reference numerals are generally repeated where identical elements appear in more than one figure. Turning now to the drawings, and in particular to FIGS. 1 and 2, there is shown an exemplary embodiment of an integrated circuit implemented on a semiconductor wafer or base substrate 11. FIG. 1 is a plan view and FIG. 2 is a cross sectional view of FIG. 1 taken at section 2—2. The base substrate 11 includes substantially flat and opposing sides 12 and 14. A primary flat 16 and a secondary flat 18 are ground or otherwise formed in the base substrate 11 for alignment purposes. The number and configuration of the flats is largely a matter of design discretion. The integrated circuit 10 consists of a first plurality of integrated circuits 20 fabricated on the side 12 and a second plurality 22 of integrated circuits fabricated on the side 14. The pluralities 20 and 22 of integrated circuits may consist of a plurality of individual die that are designed to be diced up into individual die and packaged or surfaced mounted as the case may be during subsequent processing. Alternatively, the pluralities 20 and 22 of integrated circuits may be interconnected on the wafer 11 to function as a wafer scaled integrated circuit.

Figure 3:
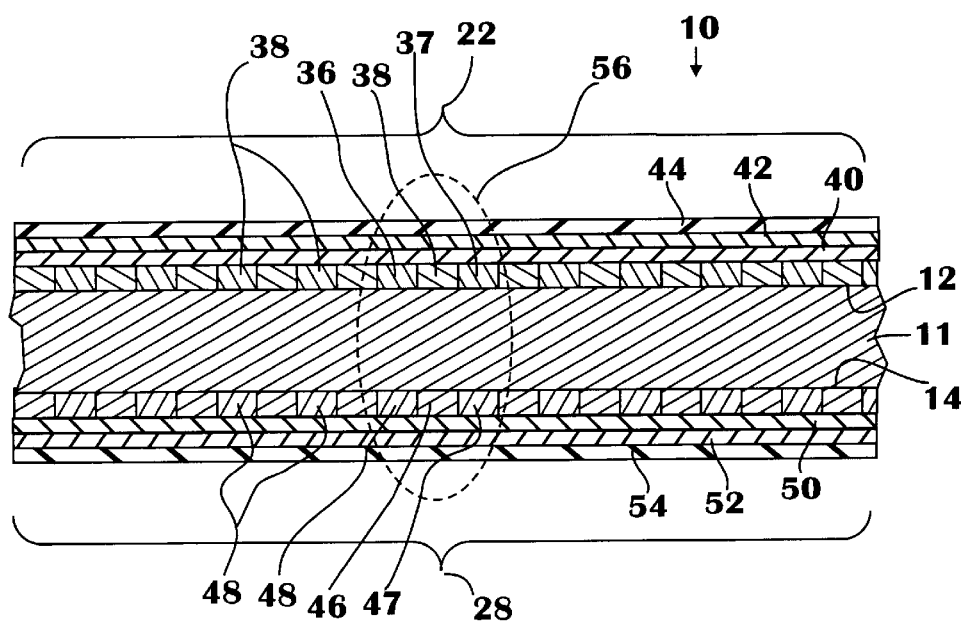
FIG. 3 is a highly magnified view of a selected portion of FIG. 2 in accordance with the present invention.

The detailed structure of the wafer 10 may be understood by referring now also to FIG. 3, which is a highly magnified cross-sectional view of the portion of FIG. 2 generally circumscribed by the dashed oval 24. As shown in FIG. 2, the dashed oval 24 circumscribes an integrated circuit 26 positioned on the side 12 and an integrated circuit 28 positioned on the side 14. The integrated circuit 26 consists of a plurality of circuit devices, two of which are designated 36 and 37 respectively, that are individually isolated laterally by an isolation structure 38 which appears as a plurality of structures in FIG. 3. The isolation structure 38 is a moat-like structure that surrounds the individual circuit devices 36. An interlevel dielectric layer 40 overlies the circuit devices 36 and the isolation structure 38 and is capped by a global interconnect layer 42. The global interconnect layer 42 is, in turn, covered by a protective polymer or oxide layer 44. There may be several such interlevel dielectric layers 40 and global interconnect layers 42. However, for simplicity of illustration, only the single interlevel dielectric layer 40 and the global interconnect layer 42 are depicted. The interlevel level dielectric layer 40 may be composed of a variety of suitable interlevel dielectric materials, such as silicon dioxide, tetra-ethyl-ortho-silicate ("TEOS"), doped glass or the like. The global interconnect layer 42 may be composed of a variety of conducting materials, such as aluminum, copper, titanium, polysilicon, or the like. The protective coating layer 44 may be composed of a variety of suitable materials used to protect the top surface of an integrated circuit, such as polyimide, silicon dioxide or the like.

The integrated circuit 28 consists of a plurality of circuit devices, two of which are designated 46 and 47 respectively, that are interspersed between an isolation structure 48 in the manner described above in conjunction with the isolation structure 38 and the circuit devices 36 and 37. The integrated circuit 28 may be provided with an interlevel dielectric layer 50, a global interconnect layer 52 and a protective coating layer 54 that may be substantially identical to the aforementioned interlevel dielectric layer 40, global interconnect layer 42 and the protective coating layer 44.

Figure 4:
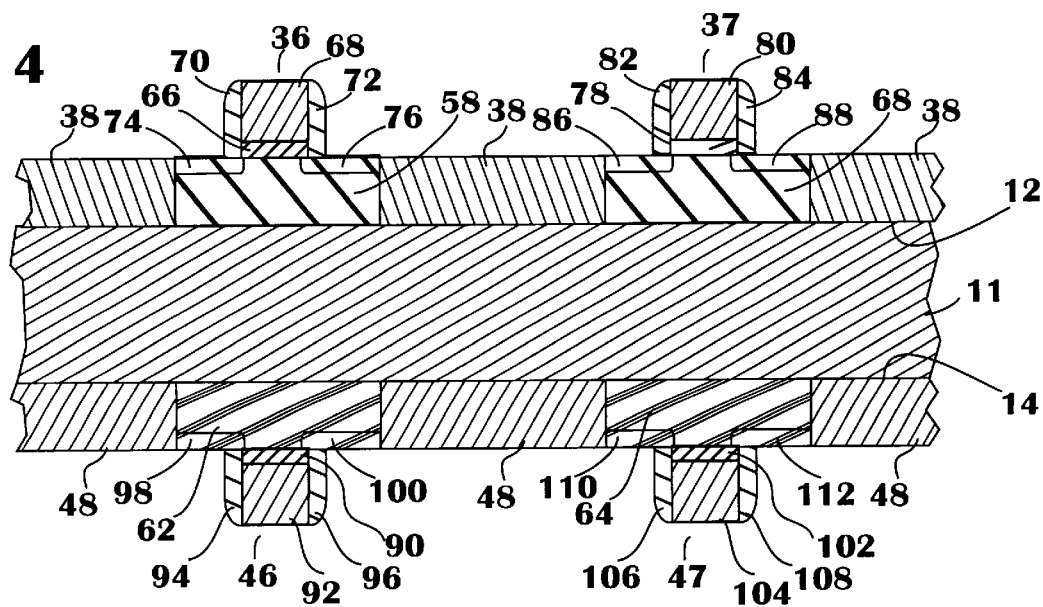
FIG. 4 is a highly magnified view of a selected portion of FIG. 3 in accordance with the present invention.

The detailed structure of the circuit devices 36, 37, 46 and 47 may be understood by referring now also to FIG. 4, which is a highly magnified cross sectional view of the portion of FIG. 3 circumscribed generally by the dashed oval 56. As is illustrated in FIG. 4, the circuit devices 36, 37, 46 and 47 are positioned on respective active areas 58, 60, 62 and 64. The active areas 58 and 60 are themselves positioned on the side 12 of the base substrate 11, while the active areas 62 and 64 are positioned on the side 14 of the base substrate 11. For the purpose of illustration, the circuit devices 36, 37, 46 and 47 are depicted as field effect transistors. However, the skilled artisan will appreciate that the circuit devices 36, 37, 46 and 47 may be implemented as a variety of different types of electronic components, such as capacitors, transistors, resistors, or the like. The transistors 36, 37, 46 and 47 may be implemented as n-channel or p-channel transistors. In the illustrated embodiment, the transistors 36 and 46 are implemented as n-channel transistors while the transistors 37 and 47 are implemented as p-channel transistors. The transistor 36 includes a gate dielectric layer 66 positioned on the active area 58, a gate electrode 68 positioned on the gate dielectric layer 66, and dielectric sidewall spacers 70 and 72 that bracket the gate electrode 68 and the gate dielectric layer 66. Source/drain regions 74 and 76 are formed in the active area 58. The phrase "source/drain region(s)" is used herein to describe a region that may serve as either a source or a drain. The skilled artisan will appreciate that a source/drain region may function as a source or a drain depending upon how it is interconnected during metallization. The transistor 37 includes a similar gate dielectric layer 78, and spacers 82 and 84, as well as source/drain regions 86 and 88 formed in the active area 60. Since the transistor 37 is implemented as a p-channel transistor, the active area 60 is provided with a slightly longer lateral dimension than the active area 58, which is designed to accommodate a n-channel transistor. The source/drain regions 86 and 88 are established by introduction of a p-type dopant into the active area 60 as described more fully below.

In like manner, the transistor 46 is provided with a gate dielectric layer 90 positioned on the active area 62, a gate electrode 92 positioned on the gate dielectric layer 90 and dielectric spacers 94 and 96 positioned adjacent to the gate dielectric layer 90 and the gate electrode 92. Source/drain regions 98 and 100 are positioned in the active area 62. The transistor 47 is similarly provided with a gate dielectric layer 102 that is positioned on the active area 64, a gate electrode 104 positioned on the gate dielectric layer 102 and dielectric spacers 106 and 108 positioned adjacent to the gate dielectric layer 102 and the gate electrode 104. Source/drain regions 110 and 112 are positioned in the active area 64.

Figure 5:
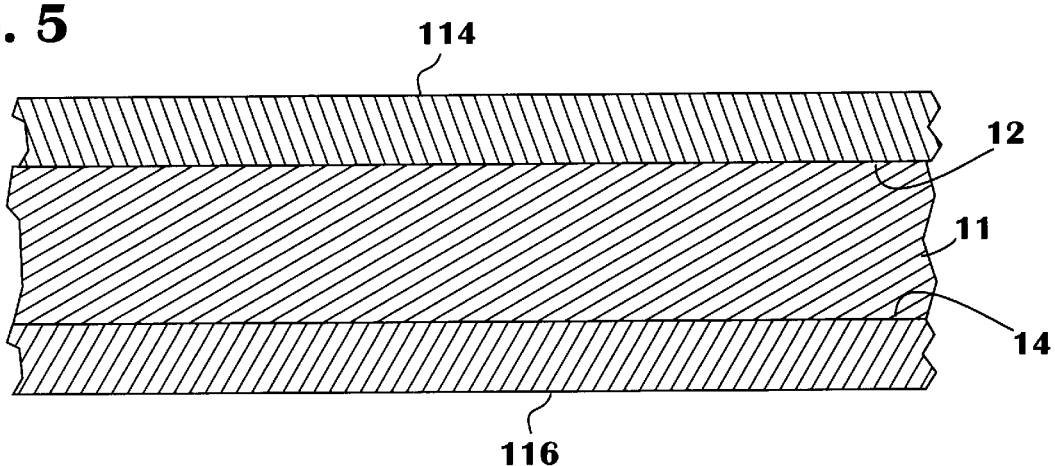
FIG. 5 is cross-sectional view like FIG. 4, but depicts the initial processing of a base substrate in accordance with the present invention.

An exemplary process flow for fabricating the integrated circuit 10 depicted in FIGS. 1, 2 and 3, and more specifically, the transistors 36, 37, 46 and 47 depicted in FIG. 4 may be understood by referring now to FIGS. 5, 6, 8, 9, 10, 11, 12, 13 and 14, and initially to FIG. 5. As a preliminary matter, the base substrate 11 is provided and polished to establish the opposing sides 12 and 14 with a relatively high degree of planarity. The base substrate 11 may be composed of a variety of suitable semiconductor materials, such as silicon, germanium or the like. If high voltage or high energy radiation environments are anticipated, the substrate 11 may be composed of material suitable for silicon-on-insulator processing, such as sapphire or the like. In an exemplary embodiment, the base substrate 11 is composed of monocrystalline {100} silicon with an initial light p-type doping. The isolation structures 38 and 48 depicted in FIG. 4 are established by initially forming insulating layers 114 and 116 respectively on the sides 12 and 14. As used herein, the terms "formed on" or "disposed on" or "positioned on" should be construed to include the possibility that a given structure or layer may be formed on another given layer with a third or other intervening layers disposed between the two. The insulating layers 114 and 116 may be composed of a variety of insulating materials suitable for isolation structures, such as, for example, silicon dioxide, TEOS, doped glass, silicon nitride, silicon oxynitride, or the like. As used herein, the phrase "composed of" is not intended to exclude the incorporation of other constituents in a given layer. A variety of formation techniques may be employed, such as, for example, CVD, low pressure CVD, plasma enhanced CVD, oxidation or the like. In an exemplary embodiment, the layers 114 and 116 are composed of silicon dioxide and are formed by CVD. The layers 114 and 116 may have a thickness of about 2000 to 5000 Å.

Figure 6:
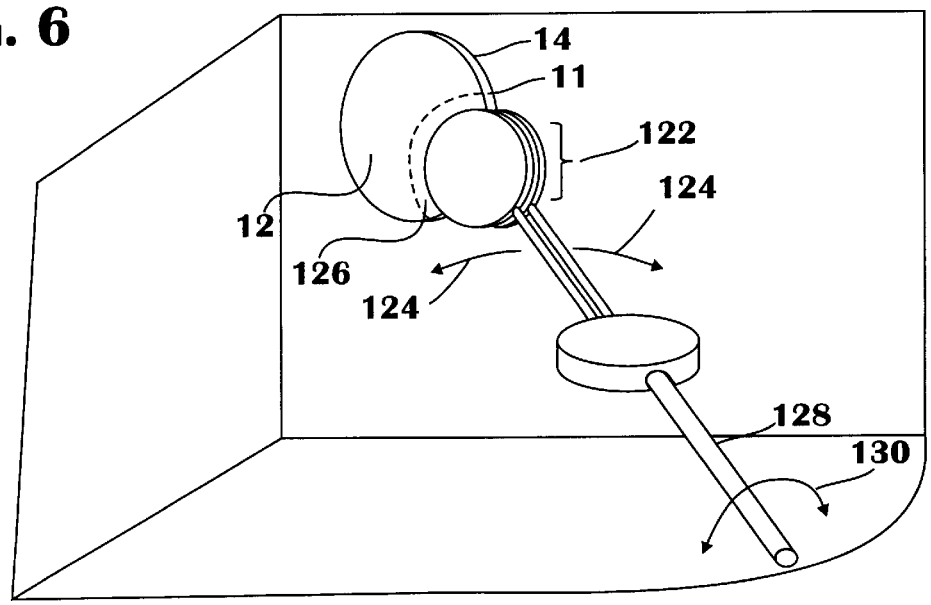
FIG. 6 is a pictorial view of an exemplary reactor chamber with the base substrate positioned therein by an exemplary wafer handler in accordance with the present invention.
Figure 7:
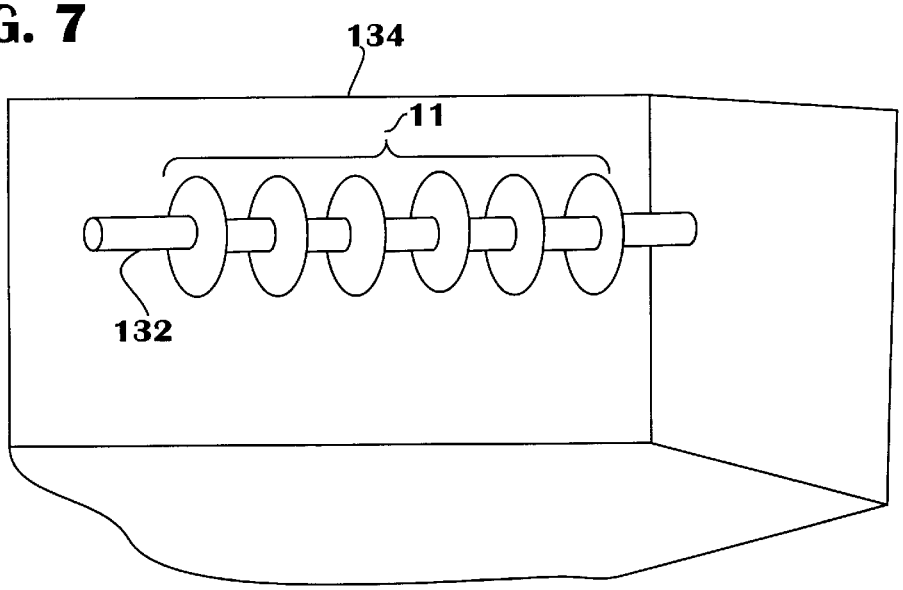
FIG. 7. is a pictorial view like FIG. 6, but depicts the positioning of a plurality of circlet wafers in a reactor chamber in accordance with the present invention.

Throughput of the formation of the insulating layers 114 and 116 may be enhanced by processing both sides 12 and 14 of the base substrate 11 simultaneously. This entails exposing both sides 12 and 14 simultaneously to the processing ambient, be it an etch ambient, a CVD ambient or other type of processing ambient. The simultaneous exposure of both sides 12 and 14 of the base substrate 11 may be accomplished in a variety of ways, two of which are depicted in FIGS. 6 and 7. FIG. 6 depicts a pictorial view of an exemplary wafer handler 118 positioned in a reactor chamber 120, most of which is cut away for simplicity of illustration. The wafer handler 118 includes a set of tongs 122 that are pivotable as indicated by the arrows 124 to selectively grasp the base substrate 11. A small portion 126 of the base substrate 11 near the outer rim thereof may be set aside for the tong assembly 122 to grasp. The tong assembly 122 is connected proximally to a mandrel 128 that is rotatable as indicated by the arrows 130 to enable the base substrate 11 to be rotated through a vertical plane. In this way, the base substrate 11 may be spatially manipulated so that a given side, for example the side 12 may be exposed to a particular instrument, such as the discharge of an implanter, as desired. The mandrel 128 may be secured to a variety of rotating mechanisms, (not shown) such as a pneumatic motor, a hydraulic motor, an electric motor or the like. The tong assembly 122 may be similarly activated by pneumatic, electrical or hydraulic means.

FIG. 7 shows a pictorial view of an alternative arrangement suitable for simultaneously processing both sides of the base substrate 11 where the base substrate 11 is initially configured as a circlet wafer. FIG. 7 is a pictorial view of a plurality of circlet wafers or base substrates 11 slipped over a mandrel 132 that is shown positioned in a processing chamber 134, most of which is depicted cut away for simplicity of illustration. As shown in this illustration, multiple base substrates 11 may be dual-side processed in a batch process.

Figure 8:
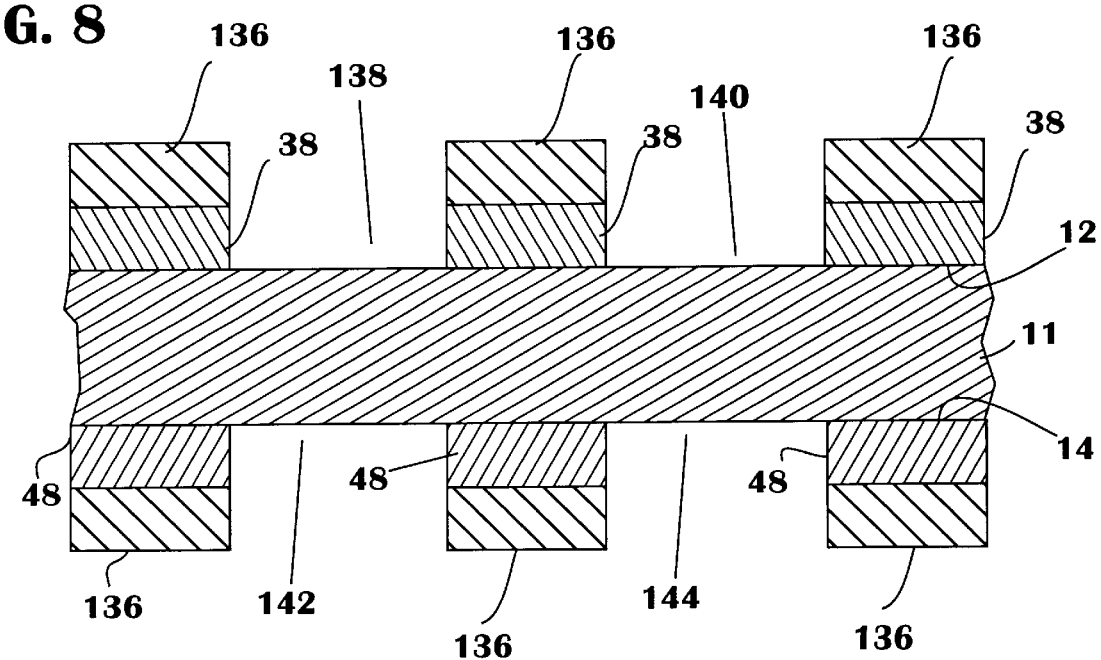
FIG. 8 is a cross-sectional view like FIG. 5 depicting definition of electrical isolation structures on both sides of the base substrate in accordance with the present invention.
Figure 9:
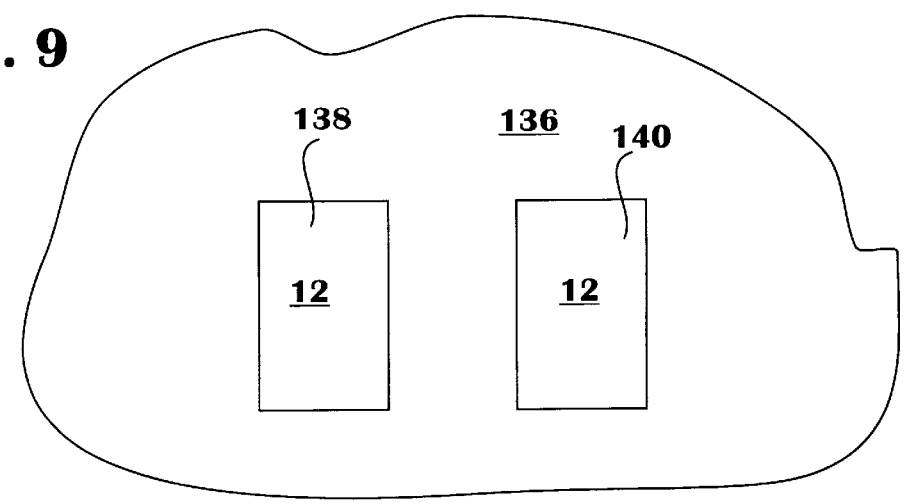
FIG. 9 is a plan view of one the structures shown in FIG. 8 and depicts openings formed in that isolation structure in accordance with the present invention.

Referring now to FIG. 8, the isolation structures 38 and 48 are defined in a damascene process. Photoresist 136 is applied to the insulating layers 114 and 116, patterned, that is, exposed and developed and the insulating layers 114 and 116 are anisotropically etched to the respective sides 12 and 14 of the base substrate 11 to define openings 138 and 140 in the isolation structure 38 and corresponding openings 142 and 144 in the isolation structure 48. The anisotropic etch may be by reactive ion etching, chemical plasma etching or other anisotropic etching technique, and may utilize a variety of etch chemistries suitable for anisotropically etching silicon dioxide, such as $CF_4/H_2$. Selectivity to the underlying silicon base substrate 11 is desirable.

Figure 10:
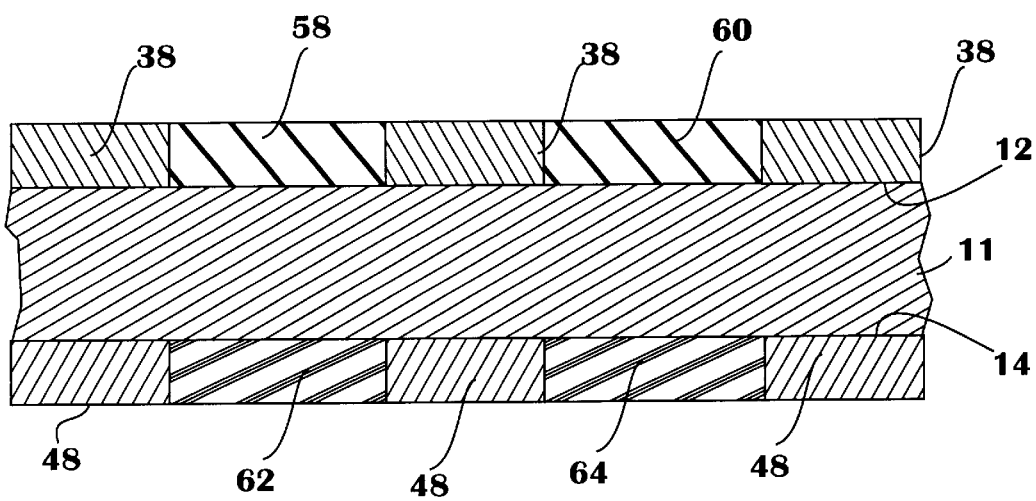
FIG. 10 is a cross-sectional view like FIG. 8 depicting formation of semiconductor layers or active areas in openings defined by the isolation structures in accordance with the present invention.
Figure 11:
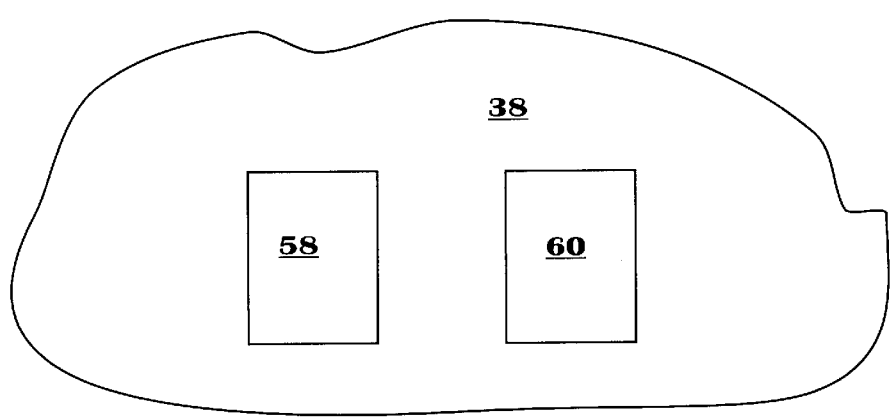
FIG. 11 is plan view like FIG. 9 but depicts the formed semiconductor layers in accordance with the present invention.

Referring now to FIGS. 10 and 11, the active areas 58, 60, 62 and 64 are established by epitaxial growth of silicon. The reactant species may be $SiH_4$, $SiHCl_3$, $SiH_2Cl_2$, $SiC_4$ or the like. The temperature and time parameters for the epitaxial growth process are largely a matter of design discretion. In an exemplary embodiment, $SiH_4$ is exposed in vapor phase at about 800 to 1050° C. The duration of the epi step will depend on the amount of silicon deposited. For example, where the base substrate 11 is processed as a single wafer, the epi growth step is performed for about 1 to 3 minutes. If, on the other hand, the base substrate 11 is among many such base substrates processed in batch, the duration may be about 10 to 30 minutes. It is anticipated that the epitaxially grown silicon will deposit with a crystal orientation that matches the underlying crystal orientation of the base substrate 11. Thus, where the base substrate 11 is cut as {100} silicon, the active areas 58, 60, 62 and 64 will grow as {100} silicon.

It is desirable to fabricate the active areas 58, 60, 62 and 64 with an initial doping level. In this regard, impurity atoms may be introduced into the epi ambient. The conductivity type may be n-type or p-type as desired. In an exemplary embodiment, boron is introduced in a vapor phase to establish a light p-type doping in the active areas 58, 60, 62 and 64. If adjacent devices, such the pair of transistors 36 and 37 and the pair of transistors 46 and 47, will be implemented in CMOS, well implants of opposite conductivity type may be performed in the adjacent active areas 58 and 60 and the adjacent active areas 62 and 64. For example, the active areas 58 and 62 may be implanted with a p-type dopant, such as arsenic, at an energy of about 200 to 300 keV and a dosage of about 1E12 to about 1E13 $cm^{-2}$ while the active areas 60 and 64 may be implanted with a n-type dopant, such as boron, at an energy of about 75 to 100 keV and a dosage of about 1E12 to about 1E13 $cm^{-2}$. Flip-flopped masking of adjacent active areas on each side 12 and 14 prior to each implant will be required.

The skilled artisan will appreciate that since both sides 12 and 14 of the base substrate 11 are being utilized, conventional extrinsic gettering will be problematic. However, an intrinsic gettering process to tailor the oxygen distribution within the base substrate 11 may be appropriately applied. In an exemplary embodiment, the base substrate 11 is subjected to a high temperature step at about 900 to about 1100° C. to form denuded zones near the sides 12 and 14. A low temperature step is then performed at about 500 to 600° C. to homogeneously nucleate $SiO_x$ precipitation sites. Finally, a second high temperature step is performed at about 900 to about 1100° C. for precipitate growth and gettering.

Figure 14:
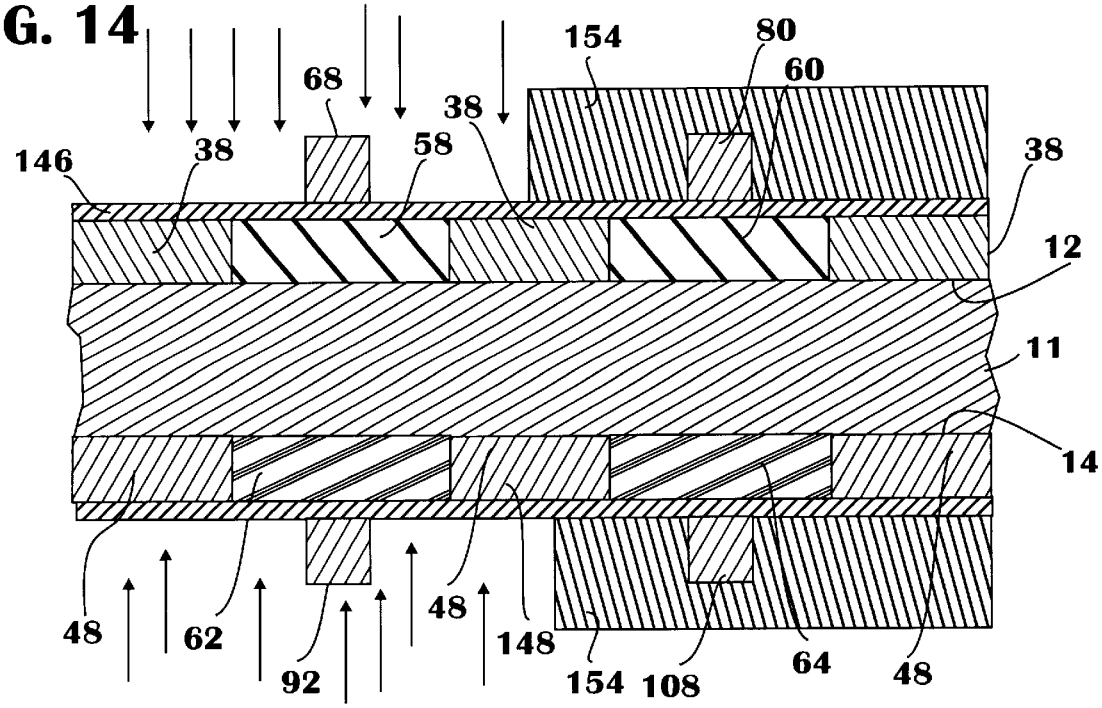
FIG. 14 is a cross-sectional view like FIG. 13 depicting formation of source/drain regions on both sides of the base substrate in accordance with the present invention.

The fabrication of the transistors 36, 37, 46 and 47 depicted in FIG. 4 may be understood by referring now to FIGS. 12,13 and 14, and initially to FIG. 12. Initially, insulating layers 146 and 148 are formed, respectively, over the isolation structure 38 and the active areas 58 and 60, and over the isolation structure 48 and active areas 62 and 64. Through subsequent processing, the insulating layer 146 will be patterned and etched to define the gate dielectric layers 66 and 78 shown in FIG. 4. Similarly, the insulating layer 148 will be subsequently patterned and etched to define the gate dielectric layers 90 and 102 shown in FIG. 4. The insulating layers 146 may be composed of a variety of suitable gate dielectric materials, such as silicon dioxide, silicon nitride, silicon oxynitride, $Ta_2O_5$, composites of these materials, or the like, and may be formed by CVD or thermal oxidation as desired. In an exemplary embodiment, the layers 146 and 148 are composed of silicon dioxide and are established by blanket CVD. The CVD of the layers 146 and 148 may be conducted simultaneously using the techniques described in conjunction with FIGS. 6 and 7 or other suitable techniques providing for the simultaneous processing of both sides of the base substrate 11. The layers 146 may have a thickness of about 10 to 50 Å.

Following formation of the insulating layers 146 and 148, conductor layers 150 and 152 are respectively formed on the insulating layers 146 and 148. Through subsequent processing, the conductor layers 150 and 152 will be patterned and etched to define, respectively, the gate electrodes 68 and 80, and the gate electrodes 92 and 104 depicted in FIG. 4. Accordingly, the conductor layers 150 and 152 are advantageously composed of a suitable gate electrode material, such as, for example, polysilicon, tantalum, titanium, aluminum, copper or the like, and may be deposited by CVD, metal organic CVD, jet vapor deposition, sputter deposition or like techniques. In an exemplary embodiment, the conductor layers 150 and 152 are composed of polysilicon and are deposited by CVD at a temperature of about 625° C. or greater to a thickness of about 750 to 1800 Å.

Referring now also to FIG. 13, the conductor layers 150 and 152 shown in FIG. 12 are masked and anisotropically etched to yield the defined the gate electrodes 68, 80, 92 and 108. The insulating layers 146 and 148 may be left in place at this point to serve as implant screens during subsequent formation of source/drain regions as shown, or alternatively, may be anisotropically etched away to yield the defined gate dielectric layers 66, 78, 90 and 102 shown in FIG. 4. The anisotropic etch of the conductor layers 150 and 152 may be by reactive ion etching, chemical plasma etching or other suitable anisotropic etching techniques using a chemistry suitable to anisotropically etch polysilicon selective to the underlying silicon dioxide layers 146 and 148, such as, for example, $CF_4/O_2$. Chemical plasma etching may be more suitable than reactive ion etching for simultaneously etching the opposing conductor layers 150 and 152 since most reactive ion etching tools are capable of accelerating etchant atoms toward only one targeted surface at a time. Where reactive ion etching is employed, it may be more appropriate to etch one of the conductor layers, either 150 or 152 first and then flip the base substrate 11 over and etch the remaining conductor layer either 150 or 152 as the case may be.

The fabrication of the source/drain regions 74, 76, 86, 88, 98, 100, 110 and 112 depicted in FIG. 4 may be understood by referring now to FIG. 14. The source/drain regions 74, 76, 86, 88, 98, 100, 110 and 112 may be established by diffusion or ion implantation as desired. In one exemplary embodiment, the source/drain regions 74, 76, 86, 88, 98, 100, 110 and 112 are established by diffusion. Where all of the source/drain regions 74, 76, 86, 88, 98, 100, 110 and 112 will have the same conductivity type, for example, n-type, both sides 14 and 16 of the base substrate 11 may be simultaneously exposed to an ambient containing a n-type impurity in the vapor phase, such as a phosphorus, in a rapid thermal anneal ("RTA") at about 600 to 800° C. for about 10 to 60 seconds. The period will be longer for batch processing. Where opposite conductivity types are desired for adjacent devices, such as the transistors 36 and 37, the devices 36 and 37 may be sequentially masked and subjected to the aforementioned RTA diffusion. For example, as shown in FIG. 14, the device 37 may be masked with photoresist 154 while the device 36 is exposed to the RTA diffusion. The device 36 may then be similarly masked and the device 37 unmasked by ashing and subjected to RTA diffusion. Simultaneous formation of source/drain regions on both sides 14 and 16 of the base substrate 11 is possible independent of the particular conductivity types of the source/drain regions 74, 76, 86, 88, 98, 100, 110 and 112. Note also that the where the gate electrodes 68, 80, 92 and 104 are composed of polysilicon, the diffusion will establish the requisite level conductivity for device operation.

In another exemplary embodiment, the source/drain regions 74, 76, 86, 88, 98, 100, 110 and 112 are established by ion implantation. The source/drain regions 74, 76 and 98 and 100 for the transistors 36 and 46 are implanted first with the active areas 60 and 64 masked with photoresist 154. The insulating layers 146 and 148 serve as screen oxides against the implants to enable establishment of very shallow junctions for the source/drain regions 74, 76, 98 and 100. A variety of n-type dopants may be used, such as, for example, arsenic, phosphorus or the like. In an exemplary embodiment, arsenic is implanted with an energy of about 10 to 50 keV and a dosage of about 1E15 to 1E16 $cm^{-2}$. The source/drain regions 74, 76, 86, 88, 98, 100, 110 and 112 may be single-graded or incorporate lightly doped drain ("LDD") structures. In an exemplary embodiment, the source/drain regions 74, 76, 86, 88, 98, 100, 110 and 112 are single-graded. The implants may be on or off axis. To establish the source/drain regions 78, 88 and 110 and 112 for the p-channel transistors 37 and 47 shown in FIG. 4, the masks are flip-flopped, that is, the photoresist 154 shown in FIG. 14 is stripped by ashing and identical photoresist masks (not shown) are formed over the active areas 58 and 62 and the active areas 60 and 64 are then implanted with dopant ions of an opposite conductivity type, such as boron, $BF_2$ or the like. The p-type implant for the source/drain regions 86, 88, 110 and 112 for an exemplary embodiment may be performed using boron with a dosage of about 1E15 to 1E16 $cm^{-2}$ and an energy of about 3 to 15 keV. Again, the implant may be on or off axis as desired. As with the aforementioned diffusion process, the implants will establish the requisite level of gate conductivity where the gate electrodes 68, 80, 92 and 104 are composed of polysilicon.

Figure 15:
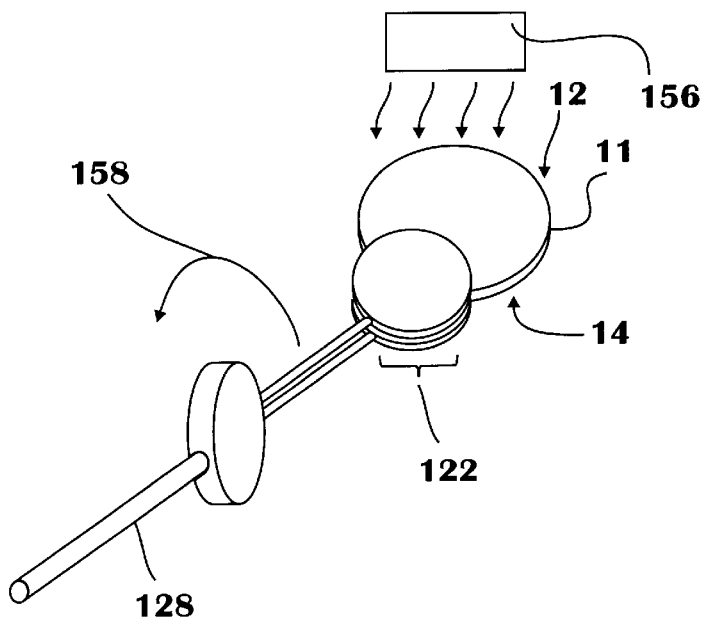
FIG. 15 is a pictorial view depicting the wafer handler of FIG. 6 manipulating the base substrate to sequentially implant the opposite sides thereof in accordance with the present invention.

Most conventional implantation tools are capable of implanting only one side of a given substrate at a time. Accordingly, one side of the base substrate 11 may be exposed to the implanter to implant those regions on a given side, such as the side 12 and then the base substrate 11 may be flipped over to expose the opposite side 14 to the implanter. For example, as shown in FIG. 15, which is a pictorial view of the wafer handler 118 originally shown in FIG. 6, the source/drain regions 74 and 76 may be implanted by exposing the side 12 of the base substrate 11 to the implanter, represented schematically by the box 156, and then rotated in the direction of the arrow 158 to expose the flip side 14 to the implanter 156.

Activation of the source/drain regions 74, 76, 86, 88, 98, 100, 110 and 112 may be by subsequent high temperature steps for interlevel dielectric formation. If desired, a separate anneal step may be performed at about 700 to 850° C. for about 5 to 15 seconds in a RTA or about 5 to 15 minutes in a furnace process.

Referring again to FIG. 4, the spacers 70, 72, 82, 84, 94, 96, 106 and 108 may be formed using well known conformal CVD or thermal oxidation as desired. Conformal dielectric layers (not shown) are formed on both sides 12 and 14. The layers may be composed of a variety of materials commonly used for dielectric spacers, such as silicon nitride, silicon dioxide, silicon oxynitride, or the like. In an exemplary embodiment, the layers are composed of silicon nitride deposited by low pressure or plasma CVD to a thickness of about 20 to 100 Å and advantageously to about 60 Å. The layers are then anisotropically etched to yield the spacers 70, 72, 82, 84, 94, 96, 106 and 108. The etch may be by reactive ion etching, chemical plasma etching, or other suitable anisotropic etching techniques utilizing a chemistry suitable for anisotropically etching silicon nitride, such as $CF_4/O_2$.

Referring again to FIG. 4, the interlevel dielectric layers 40 and 50 and the global interconnect layers 42 and 52 may be formed following spacer definition. The interlevel dielectric layers 40 and 50 may be formed using well known CVD or spin-on techniques and may be accompanied by reflow and planarization. The global interconnect layers 42 and 52 may be similarly formed and planarized. The protective coatings 44 and 54 may be deposited ID by similar techniques.

An alternate exemplary process flow in accordance with the present invention may be understood by referring now to FIGS. 16, 17 and 18. FIG. 16 is a cross sectional view like FIG. 5 depicting the base substrate 11 following simultaneous blanket epitaxial growth of semiconductor layers 158 and 160 on the opposing sides 12 and 14. Through subsequent patterning and etching, the semiconductor layers 158 and 160 will be etched to define active areas of the type depicted in FIGS. 10 and 11. Accordingly, the semiconductor layers 158 and 160 are advantageously composed of epitaxially grown silicon and may be in situ doped with n or p-type dopants. In an exemplary embodiment, both the semiconductor layers 158 and 160 are in situ doped with boron. The layers 158 and 160 may be about 2000 to 5000 Å thick. The same temperature and time parameters described above in conjunction with the epitaxial growth process shown in FIG. 9 may be employed albeit with a somewhat longer duration to account for the extra material being grown.

Next and as shown in FIG. 17, the semiconductor layers 158 and 160 are masked and anisotropically etched to yield the defined active areas, now designated 58', 60', 62' and 64'.

The anisotropic etch may be by reactive ion etching, chemical plasma etching or other suitable anisotropic etching techniques, and may use a variety of chemistry suitable for anisotropically etching silicon, such as, for example, $CF_4/O_2$. Endpoint detection may be derived from the anticipated etch rate of the semiconductor layers 158 and 160. The etch yields a moat 164 surrounding the active areas 58' and 60' and a corresponding moat 166 that surrounds the active areas 62' and 64'. Referring now also to FIG. 16, an insulating material is blanket deposited in the moats 164 and 166 and planarized to the active areas 58' and 60' and 62' and 64' to yield the defined isolation structures, now designated 38' and 48'. The material deposited to establish the isolation structures 38' and 48' may be a variety of dielectric materials suitable for device isolation, such as, for example, silicon dioxide, TEOS, doped glass or the like. CVD, jet vapor, sputter definition or the like may be employed. In an exemplary embodiment, the isolation structures 38' and 48' are composed of silicon dioxide established by CVD. The planarization to the active areas 58', 60', 62' and 64' may be by etchback planarization, CMP or the like. In an exemplary embodiment, CMP is used for the planarization step. With the isolation structures 38' and 48' and the active areas 58', 60', 62' and 64' established, the process flow may proceed as generally described above in relation to FIGS. 12, 13 and 14 to yield the completed integrated circuit 10 depicted in FIG. 1.

Figure 19:
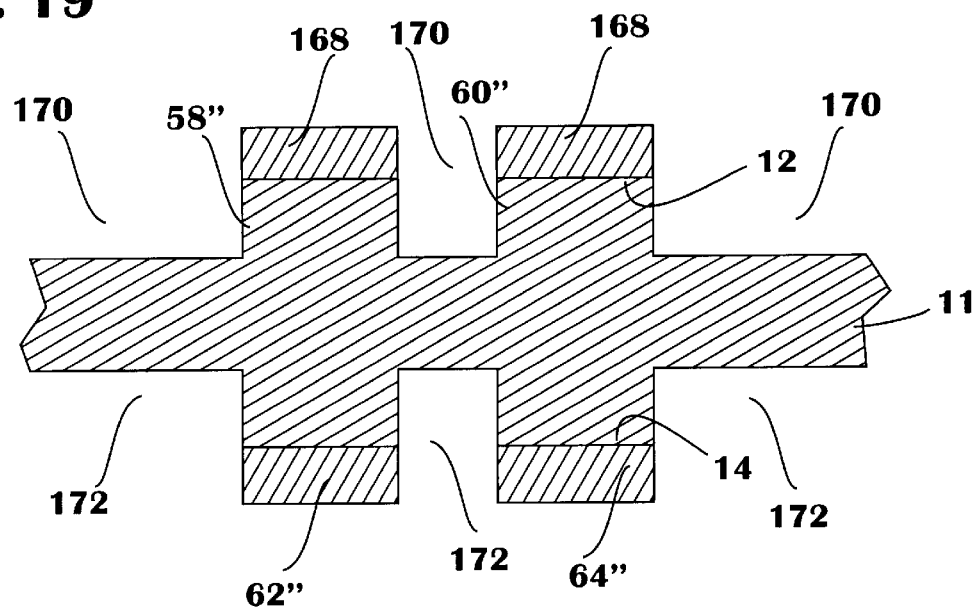
FIG. 19 is a cross-sectional view like FIG. 8, but depicts definition of active areas in an alternate exemplary process flow in accordance with the present invention.
Figure 20:
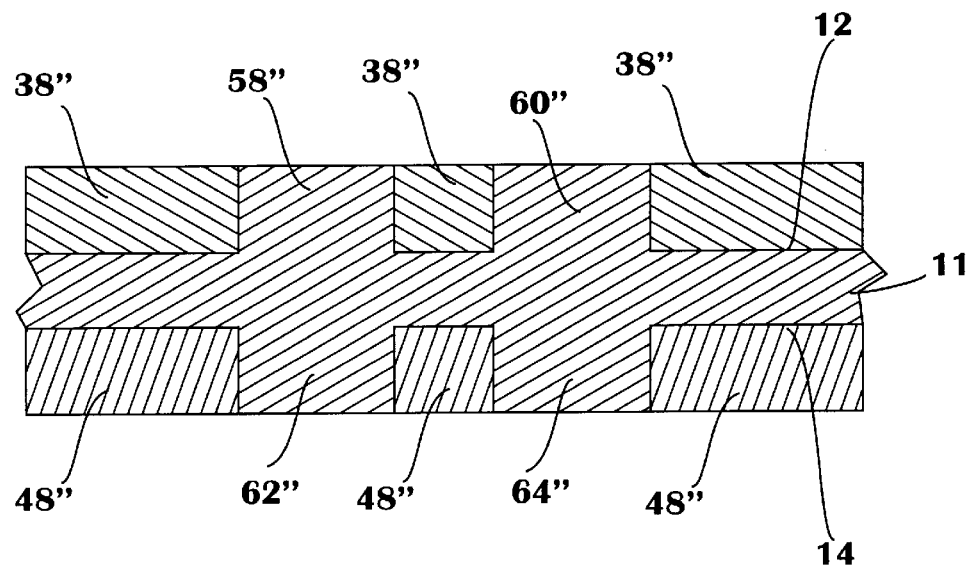
FIG. 20 is a cross-sectional view like FIG. 19 depicting formation of isolation structures around the active areas in accordance with the present invention.

Another alternate exemplary process flow in accordance with the present invention may be understood by referring now to FIGS. 19 and 20. FIG. 19 depicts a cross-sectional view of the base substrate 11 following the application and patterning of photoresist 168 to both sides 12 and 14 and an anisotropic etch of both sides 12 and 14 to yield respective moats 170 and 172. The moat 170 circumscribes defined active areas, now designated 58" and 60". Similarly, the moat 172 circumscribes defined active areas, now designated 62" and 64". Referring now also to FIG. 20, the photoresist masks 168 are stripped by ashing and isolation structures, now designated 38" and 48" are established on the respective sides 12 and 14 by blanket deposition of a dielectric material followed by planarization by etchback planarization or CMP. The isolation structures 38" and 48" may be composed of the same types of materials described above and formed using the same types of techniques described above. The base substrate 11 may then be furthered processed as described above generally in relation to FIGS. 12, 13 and 14 to yield the completed integrated circuit 10 depicted in FIG. 1. The skilled artisan will appreciate that the process of the present invention simultaneous processing of both sides of a given base substrate or wafer. The effective yield for a given wafer may be doubled without an attendant increase in fabrication time. Since both sides of a given wafer may be simultaneously processed during many phases of manufacture, the effective yield per wafer per unit time may also be increased dramatically.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor wafer, comprising:
 a base substrate having a first side and a second side;
 a first semiconductor layer positioned on the first side;
 a first isolation structure positioned on the first side and around the first semiconductor layer;
 a second semiconductor layer positioned on the second side; and
 a second isolation structure positioned on the second side and around the second semiconductor layer.

2. The semiconductor wafer of claim 1, wherein the base substrate is composed of silicon and the first and second semiconductor layers are composed of silicon.

3. The semiconductor wafer of claim 2, wherein the first and second semiconductor layers contain a dopant of a first conductivity type.

4. The semiconductor wafer of claim 2, wherein the first semiconductor layer contains a dopant of a first conductivity type and the second semiconductor layer contains a dopant of a second conductivity type.

5. The semiconductor wafer of claim 1, wherein the first and second isolation structures are composed of silicon dioxide, TEOS, silicon oxynitride, or silicon nitride.

6. The semiconductor wafer of claim 1, comprising a first electronic circuit device positioned on the first semiconductor layer and a second electronic circuit device positioned on the second semiconductor layer.

7. The semiconductor wafer of claim 1, comprising a first integrated circuit positioned on the first semiconductor layer and a second integrated circuit positioned on the second semiconductor layer.

8. A semiconductor wafer, comprising:
 a semiconductor substrate having a first side with a first plurality of active areas and a second side with a second plurality of active areas;
 a firs isolation structure positioned on the first side and laterally isolating the first plurality of active areas; and
 a second isolation structure positioned on the second side and laterally isolating the second plurality of active areas.

9. The semiconductor wafer of claim 8, wherein the semiconductor substrate is composed of silicon.

10. The semiconductor wafer of claim 8, wherein the first and second isolation structures are composed of silicon dioxide, TEOS, silicon oxynitride, or silicon nitride.

11. The semiconductor wafer of claim 8, comprising a first electronic circuit device positioned on one of the first plurality of active areas and a second electronic circuit device positioned on one of the second plurality of active areas.

12. The semiconductor wafer of claim 8, comprising a first integrated circuit positioned on one of the first plurality of active areas and a second integrated circuit positioned on one of the second plurality of active areas.

13. An integrated circuit, comprising:

a base substrate having a first side and a second side opposite the first side;

a first semiconductor layer and a first isolation structure positioned on the first side, the first isolation structure surrounding the first semiconductor layer;

a first circuit device positioned on the first semiconductor layer;

a second semiconductor layer and a second isolation structure positioned on the second side, the second isolation structure surrounding the second semiconductor layer; and a second circuit device positioned on the second semiconductor layer.

14. The integrated circuit of claim 13, wherein the first and second circuit devices comprise transistors.

15. The integrated circuit of claim 14, wherein the first and second transistors comprise field effect transistors.

16. The integrated circuit of claim 14, wherein the first and second semiconductor layer are composed of silicon.

17. The integrated circuit of claim 15, wherein the first and second semiconductor layers contain a dopant of a first conductivity type.

18. The integrated circuit of claim 15, wherein the first semiconductor layer contains a dopant of a first conductivity type and the second semiconductor layer contains a dopant of a second conductivity type.

19. The integrated circuit of claim 13, wherein the first and second isolation structures are composed of silicon dioxide, TEOS, silicon oxynitride, or silicon nitride.

20. An integrated circuit, comprising:

a base substrate having a first side and a second side opposite the first side, the first side having a first semiconductor layer and a first isolation structure positioned thereon wherein the first isolation structure surrounds the first semiconductor layer, the second side having a second semiconductor layer and a second isolation structure positioned thereon wherein the second isolation structure surrounds the second semiconductor layer;

a first circuit device positioned on the first semiconductor layer; and a second circuit device positioned on the second semiconductor layer.

21. The integrated circuit of claim 20, wherein the first and second circuit devices comprise transistors.

22. The integrated circuit of claim 21, wherein the first and second transistors comprise field effect transistors.

23. The integrated circuit of claim 20, wherein the first and second semiconductor layers are composed of silicon.

24. The integrated circuit of claim 23, wherein the first and second semiconductor layers contain a dopant of a first conductivity type.

25. The integrated circuit of claim 23, wherein the first semiconductor layer contains a dopant of a first conductivity type and the second semiconductor layer contains a dopant of a second conductivity type.

26. The integrated circuit of claim 20, wherein the first and second isolation structures are composed of silicon dioxide, TEOS, silicon oxynitride, or silicon nitride.

* * * * *